(12) United States Patent
Xian et al.

(10) Patent No.: US 10,141,350 B2
(45) Date of Patent: Nov. 27, 2018

(54) ARRAY SUBSTRATE AND DISPLAY DEVICE

(71) Applicant: BOE Technology Group Co., Ltd., Beijing (CN)

(72) Inventors: Jianbo Xian, Beijing (CN); Hongfei Cheng, Bejing (CN); Yong Qiao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/744,445

(22) PCT Filed: May 19, 2017

(86) PCT No.: PCT/CN2017/085097
§ 371 (c)(1),
(2) Date: Jan. 12, 2018

(87) PCT Pub. No.: WO2017/206736
PCT Pub. Date: Dec. 7, 2017

(65) Prior Publication Data
US 2018/0211983 A1    Jul. 26, 2018

(30) Foreign Application Priority Data

May 31, 2016    (CN) ..................... 2016 2 0518450 U

(51) Int. Cl.
*H01L 27/12*    (2006.01)
*H01L 29/786*    (2006.01)
(Continued)

(52) U.S. Cl.
CPC ........ *H01L 27/1248* (2013.01); *G02F 1/1362* (2013.01); *G02F 1/1368* (2013.01);
(Continued)

(58) Field of Classification Search
CPC ............. G02F 1/1368; G02F 1/136227; G02F 1/136286; G02F 1/134363; G02F 1/1362;
(Continued)

(56) References Cited

U.S. PATENT DOCUMENTS 8,120,727 B2 *   2/2012   Wang ................ G02F 1/133536
                                                           349/96
8,563,982 B2    10/2013   Nakamura et al.
(Continued)

FOREIGN PATENT DOCUMENTS

CN       101995700 A    3/2011
CN       202183002 U    4/2012
(Continued)

OTHER PUBLICATIONS

English translation of International Search Report and Written Opinion (Chinese version was previously-submitted at the time of filing of the instant application) for International Application No. PCT/CN2017/085097, dated Aug. 16, 2017, 12 pages.

*Primary Examiner* — Jonathan Han
(74) *Attorney, Agent, or Firm* — Westman, Champlin & Koehler, P.A.

(57) ABSTRACT

The present disclosure discloses an array substrate and a display device. The array substrate includes: a substrate; and a plurality of data lines and a plurality of gate lines disposed on the substrate, the data lines and the gate lines being configured to define a plurality of pixel units. Each pixel units includes: a pixel electrode; a thin film transistor electrically connected to the data line and the gate line and configured to drive the pixel electrode; and a resin layer disposed on the data line and/or the gate line and provided with at least one gas discharging structure each having an opening facing away from the substrate.

20 Claims, 4 Drawing Sheets

(51) Int. Cl.
*G02F 1/1362* (2006.01)
*G02F 1/1368* (2006.01)
*H01L 23/26* (2006.01)
*G02F 1/1333* (2006.01)

(52) U.S. Cl.
CPC ............ H01L 23/26 (2013.01); H01L 27/124 (2013.01); *G02F 1/133345* (2013.01); *G02F 1/136286* (2013.01); *G02F 2001/136222* (2013.01)

(58) Field of Classification Search
CPC ............. G02F 1/134309; H01L 27/124; H01L 27/1222; H01L 27/1248; H01L 27/1259; H01L 27/1288
USPC .......................................................... 257/72
See application file for complete search history.

(56) References Cited

U.S. PATENT DOCUMENTS

| | | | |
|---|---|---|---|
| 9,170,463 | B2 | 10/2015 | Nakamura et al. |
| 9,568,795 | B2 | 2/2017 | Nakamura et al. |
| 2007/0064166 | A1* | 3/2007 | Lee .................. G02F 1/136227 349/42 |
| 2015/0380434 | A1* | 12/2015 | Cheng .................. H01L 27/124 257/72 |

FOREIGN PATENT DOCUMENTS

| | | |
|---|---|---|
| CN | 102540603 A | 7/2012 |
| CN | 204905257 U | 12/2015 |
| CN | 205787504 U | 12/2016 |
| KR | 10-1183300 A | 9/2012 |

* cited by examiner

ARRAY SUBSTRATE AND DISPLAY DEVICE

CROSS-REFERENCE TO RELATED APPLICATION

This application is a Section 371 National Stage Application of International Application No. PCT/CN2017/085097, filed on May 19, 2017, which is not yet published, and claims priority to Chinese Application No. 201620518450.4, filed on May 31, 2016, incorporated herein by reference in their entirety.

BACKGROUND OF THE INVENTION

Field of the Invention

At least one embodiment of the present disclosure relates to a field of display technology, and more particularly, to an array substrate and a display device.

Description of the Related Art

In the field of display technology, a Thin Film Transistor Liquid Crystal Display (TFT-LCD), due to its small size, low power consumption, no radiation and other characteristics, is widely used in a television, a mobile phones and a public information display. The TFT-LCD includes an array substrate, a color filter substrate, and a liquid crystal layer between them.

Generally, the array substrate includes a gate disposed on a substrate, a gate line disposed in the same layer as the gate, a gate insulating layer, a semiconductor active layer, a source and a drain, a pixel electrode and the like.

SUMMARY OF THE INVENTION

At least one embodiment of the present disclosure provides an array substrate and a display device.

According to an embodiment in one aspect of the present disclosure, there is provided an array substrate, comprising: a substrate; and a plurality of data lines and a plurality of gate lines disposed on the, the data lines and the gate lines being configured to define a plurality of pixel units. Each the pixel unit includes: a pixel electrode; a thin film transistor electrically connected to the data line and the gate line and configured to drive the pixel electrode; and a resin layer disposed on the data line and/or the gate line and provided with at least one gas discharging structure each having an opening facing away from the substrate.

In the array substrate according to an embodiment of the present disclosure, the at least one gas discharging structure is disposed in a region of the resin layer that at least partially covers the thin film transistor.

In the array substrate according to an embodiment of the present disclosure, at least one of the gas discharging structures is disposed in a region of the resin layer that is overlapped with at least one of the gate line and the data line.

In the array substrate according to an embodiment of the present disclosure, the resin layer is provided with at least two gas discharging structures.

In the array substrate according to an embodiment of the present disclosure, the resin layer is provided with two gas discharging structures and a ratio of depths of openings of the two gas discharging structures is 1:10-1.

In the array substrate according to an embodiment of the present disclosure, the pixel unit includes a red sub-pixel unit, a green sub-pixel unit, and a blue sub-pixel unit, and the gas discharging structure is disposed only in a region of the resin layer aligned with the blue sub-pixel unit.

In the array substrate according to an embodiment of the present disclosure, the pixel unit includes a red sub-pixel unit, a green sub-pixel unit, and a blue sub-pixel unit, and the gas discharging structure is disposed in each region of the resin layer aligned with a corresponding sub-pixel unit.

In the array substrate according to an embodiment of the present disclosure, the array substrate further comprises a cover electrode disposed in the same layer as the pixel electrode, wherein the cover electrode covers at least a part of the gas discharging structure.

In the array substrate according to an embodiment of the present disclosure, the cover electrode on the gas discharging structure corresponding to at least one pixel unit extends to an adjacent pixel unit; or the cover electrode on the gas discharging structure corresponding to at least one thin film transistor region extends to an adjacent thin film transistor region.

In the array substrate according to an embodiment of the present disclosure, the gas discharging structure is formed as a blind hole running through at least a part of a thickness of the resin layer, a ratio of a depth of the blind hole to a thickness of the resin layer being between 0.04-0.1; or the gas discharging structure is formed as a through-hole running through the entire thickness of the resin layer.

In the array substrate according to an embodiment of the present disclosure, the resin layer is located between the data line and the pixel electrode, and comprises a color filter layer.

In the array substrate according to an embodiment of the present disclosure, a passivation layer is disposed between the data line and the color filter layer; or the passivation layer is disposed between the pixel electrode and the color filter layer.

In the array substrate according to an embodiment of the present disclosure, the array substrate further comprises a common electrode, wherein the passivation layer is located between the pixel electrode and the common electrode.

According to an embodiment in another aspect of the present disclosure, there is provided a display device, comprising the array substrate as mentioned above and an opposed substrate arranged opposite to the array substrate.

DETAILED DESCRIPTION OF PREFERRED EMBODIMENTS OF THE INVENTION

The technical solutions in the embodiments of the present disclosure will be described clearly and completely hereinafter with reference to the accompanying drawings in the embodiments of the present disclosure. Apparently, the described embodiments are merely some but not all of the embodiments of the present disclosure. All other embodiments obtained by a person of ordinary skill in the art based on the embodiments of the present disclosure without creative efforts shall fall within the protection scope of the present disclosure.

According to the general inventive concept of various embodiments of the present disclosure, there is provided an array substrate, comprising: a substrate; a plurality of data lines and a plurality of gate lines disposed on the substrate, the data lines and the gate lines being configured to define a plurality of pixel units. Each pixel units includes: a pixel electrode; a thin film transistor electrically connected to the data line and the gate line and configured to drive the pixel electrode; and a resin layer disposed on the data line and/or the gate line and provided with at least one gas discharging structure, each gas discharging structures having an opening facing away from the substrate so as to discharge gas from the resin layer.

Figure 1:
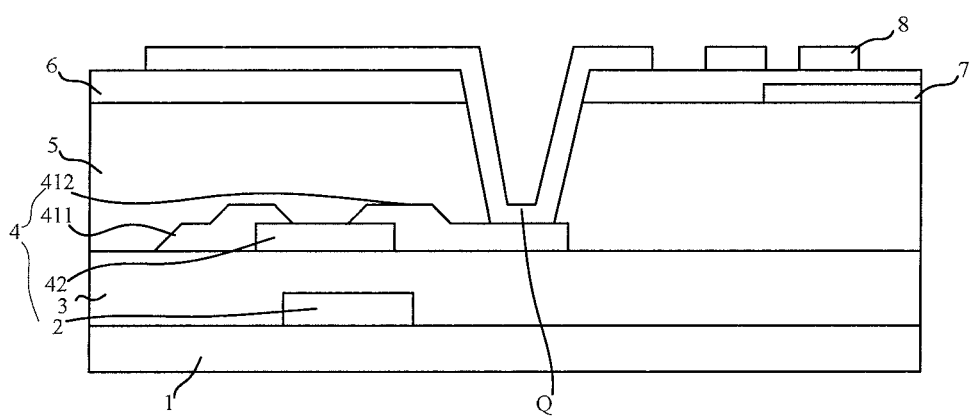
FIG. 1 is a schematic partial cross-sectional view of an array substrate according to an embodiment of the present disclosure.
Figure 2:
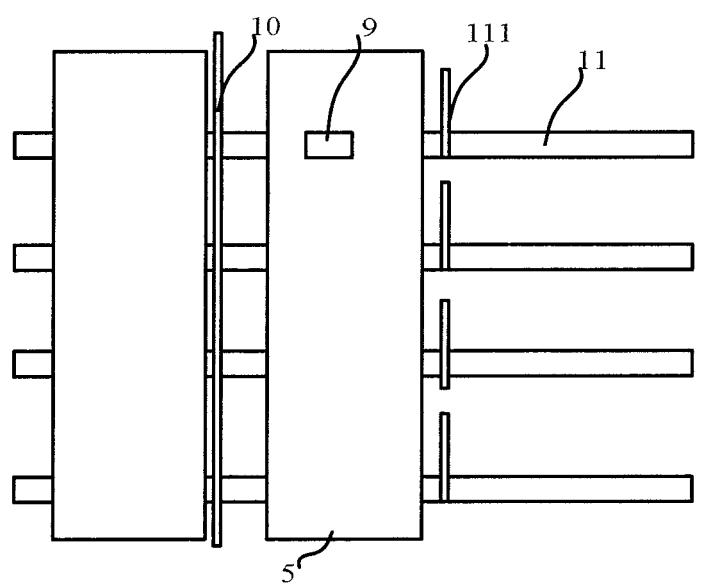
FIG. 2 is a schematic view of showing a position of a gas discharging structure in an array substrate according to an embodiment of the present disclosure.

FIG. 1 is a schematic partial cross-sectional view of an array substrate according to an embodiment of the present disclosure; and FIG. 2 is a schematic view of showing a position of a gas discharging structure in an array substrate according to an embodiment of the present disclosure. As shown in FIGS. 1 and 2, an array substrate according to an exemplary embodiment of the present disclosure comprises a gate disposed on a substrate, a gate line disposed in the same layer as the gate, a gate insulating layer, a semiconductor active layer, a source and a drain, a pixel electrode and the like.

As shown in FIG. 1 and FIG. 2, an array substrate according to an exemplary embodiment of the present disclosure includes a substrate 1, a plurality of data lines 10 and a plurality of gate lines 11 disposed on the substrate 1, the data lines 10 and the gate lines 11 being configured to define at least one pixel unit. Each pixel unit includes a thin film transistor 4, a resin layer 5, and a pixel electrode 8. The thin film transistor 4 is electrically connected to the data line 10 and the gate line 11 and configured to drive the pixel electrode 8. The resin layer 5 is disposed on the data line 10 and/or the gate line 11, for example, may be disposed between the data line 10 and/or the gate line 11, and the pixel electrode 8, and the resin layer 5 is provided with at least one gas discharging structure 9 each having an opening facing away from the substrate 1 so as to discharge gas from the resin layer 5.

According to the array substrate in the embodiment of the present disclosure, the resin layer 5 is disposed between the layer, where the data line 10 and/or the gate line 11 is located, and the pixel electrode 8, so as to reduce the parasitic capacitance between the layer where the data line 10 and/or the gate line 11 is located and the pixel electrode. For example, in a bottom-gate array substrate, electromagnetic interference to the pixel electrode caused by the data line may be avoided by setting a resin layer between the layer where the data line is located and the pixel electrode.

Further, in the above array substrate, the gas discharging structure 9 in the resin layer 5 may be configured to discharge the gas from the resin layer 5. On one hand, with this arrangement, bubbles in the resin layer 5 may be reduced and in turn a rugged phenomenon in the resin layer 5 caused by bubble expansion may be reduced to a certain extent; on the other hand, with this arrangement, the gas trapped in the resin layer 5 may be reduced, which may prevent the gas from adversely affecting the yield of the subsequent production process on the array substrate, thereby improving product yield and display effect.

In one embodiment, in each pixel unit, the thin film transistor 4 is disposed at an intersection position between the gate line 11 and the data line 10, and the at least one gas discharging structure 9 is disposed in a region of the resin layer 5 that at least partially covers the thin film transistor 4. That's to say, the gas discharging structure 9 is disposed in an overlapped region of the resin layer 5 and the thin film transistor 4. By using this kind of arrangement, it may not only discharge the bubbles in the resin layer 5, but also avoid interference on the pixel area and negative influence on the display effect.

In one embodiment, in each pixel unit, at least one gas discharging structure 9 is disposed in a region of the resin layer 5 that at least partially covers the thin film transistor 4, and the gas discharging structure 9 may be not overlapped with a channel region of the thin film transistor 4 (i.e., a space between the source and the drain of the thin film transistor 4). With this arrangement, the influence of the gas discharging structure on the performance of the channel of the film transistor 4 may be avoided as much as possible.

Figure 3:
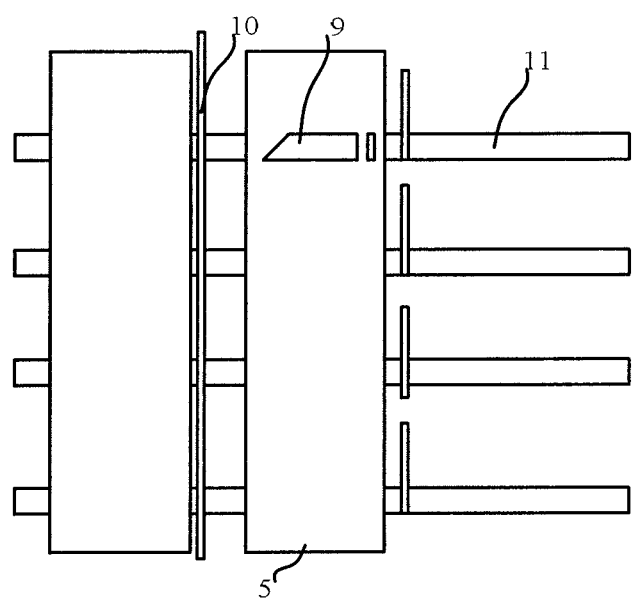
FIG. 3 is a schematic view of showing a position of an gas discharging structure in an array substrate according to another embodiment of the present disclosure.
Figure 4:
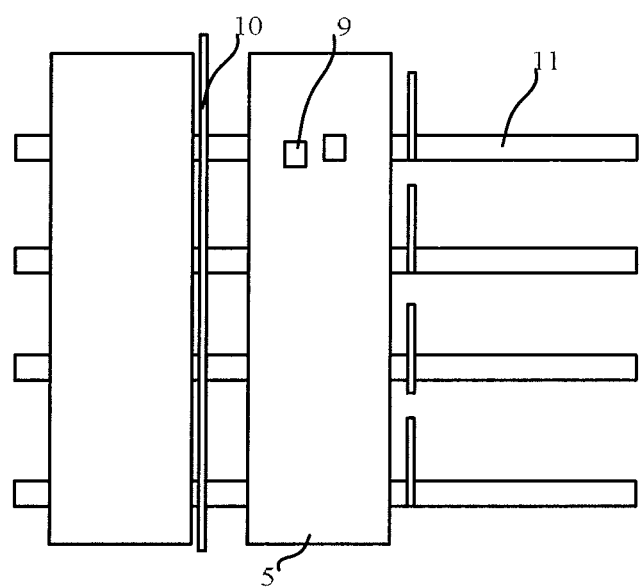
FIG. 4 is a schematic view of showing a position of the gas discharging structure in the array substrate according to still another embodiment of the present disclosure.

In one embodiment, the gas discharging structure 9 is disposed in a region of the resin layer 5 that is overlapped with at least one of the gate line 11 and the data line 10. For example, the gas discharging structure 9 is disposed in a region of the resin layer 5 that is overlapped with the gate line 11, as shown in FIGS. 2-4; the gas discharging structure 9 is disposed in a region of the resin layer 5 that is overlapped with the data line 10; and/or the gas discharging structure 9 is disposed in a region of the resin layer 5 that is overlapped with both the gate line 11 and the data line 10.

FIG. 2 shows an embodiment in which the gas discharging structure 9 is disposed in a region of the resin layer 5 that is overlapped with the gate line 11. It should be understood by those skilled in the art that the gas discharging structure 9 is not limited to the above-mentioned positions as long as the disposed position of the gas discharging structure 9 may facilitate the discharging of the gas in the resin layer or may avoid the influence on the display effect in the pixel region. For example, the gas discharging structure 9 is disposed at a position of the resin layer 5 close to the data line 10 or at an intersection position between the data line 10 and the gate line 11. In this way, it may contribute to the discharging of bubbles from the resin layer 5 at the above position.

As shown in FIG. 2, the gate line 11 is provided with a protrusion 111 electrically connected to the gate of the thin film transistor. Alternatively, the protrusion 111 may be used directly as a gate of the thin film transistor. The gas discharging structure 9 may be located at a position corresponding to the protrusion of the gate line.

In order to better eliminate air bubbles from the resin layer 5, one pixel unit may be provided with a plurality of gas discharging structures 9. FIG. 3 and FIG. 4 are schematic diagrams of two other positions of the gas discharging structures in the array substrate according to the embodiments of the present disclosure. As shown in FIG. 3 and FIG. 4, two gas discharging structures 9 are arranged in the resin layer of the pixel unit. Similar to FIG. 2, two gas discharging structures 9 are disposed in the region of the resin layer 5 that is overlapped with the gate line 11. The shape, size and depth of the gas discharging structure 9 in the resin layer 5 are not limited. Accordingly, the two gas discharging structures 9 provided in the pixel unit may be such gas discharging structures 9 that have the same shape and size, or such gas discharging structures 9 that have different shapes and sizes. For example, the two gas discharging structures 9 in FIG. 3 are of significant difference in shapes and sizes. The shape and size of the two gas discharging structures in FIG.

4 are substantially the same. A ratio of depths of the openings of the two gas discharging structures 9 in FIG. 3 or FIG. 4 may be 1:10-1, and further the ratio of depths of the openings of the two gas discharging structures 9 may be 1:6-1:3. In an alternative embodiment, one pixel unit may be provided with three gas discharging structures 9, and the ratio of depths of the openings of the three gas discharging structures 9 may be set as required. For example, the ratio of depths of the openings of the three gas discharging structures 9 may be 1:1:0.9.

In one embodiment, a slope angle of at least one gas discharging structure 9 is 15 degrees to 90 degrees. In an alternative embodiment, the slope angle of at least one gas discharging structure 9 is 20 degrees to 80 degrees, or 30 degrees to 60 degrees, or 25 degrees to 50 degrees.

In this embodiment, the pixel unit includes a red sub-pixel unit, a green sub-pixel unit and a blue sub-pixel unit arranged side by side and periodically. When at least one gas discharging structure 9 is set in the pixel unit, the gas discharging structures 9 may be disposed in each of three adjacent sub-pixel units, that is, each sub-pixel unit is provided with at least one gas discharging structure. In an alternative embodiment, the gas discharging structure is set in only one monochrome sub-pixel unit, for example, only in a region of the resin layer aligned with the blue sub-pixel unit.

In an alternative embodiment, the pixel unit includes a red sub-pixel unit, a green sub-pixel unit, a blue sub-pixel unit, and a white (or yellow) sub-pixel arranged periodically and side by side, and each sub-pixel unit is provided with at least one gas discharging structure.

In an embodiment, the resin layers for different pixel units (or sub-pixel units) may be provided as a continuous layer, or the resin layers for a part or all of the pixel units (or sub-pixel units) may be provided to be independent from each other. Alternatively, the resin layers for the pixel units (or sub-pixel units) in the same row or column are formed as an integral structure, that is, the resin layers for the pixel units (or sub-pixel units) in the same row or column are connected to each other.

In an embodiment, the array substrate may further comprise a cover electrode disposed in the same layer as the pixel electrode, and the cover electrode covers at least a part of the gas discharging structure 9.

At least a part of the gas discharging structures 9 is covered with the cover electrode, so as to at least prevent the gas, or excess residues generated during manufacturing an electrode process from accumulating in the gas discharging structure 9, and effectively prevent negative influence on the display effect. The cover electrodes of a plurality of gas discharging structures 9 may be connected with each other, or also may be separated from each other and distributed independently. In addition, the cover electrode may be arranged in the same layer as the pixel electrode 8 and may be mutually connected with the pixel electrode 8.

In an alternative embodiment, the cover electrode on the gas discharging structure 9 for at least one pixel unit (or sub-pixel unit) extends to an adjacent pixel unit (or sub-pixel unit). For example, the cover electrode on the gas discharging structure 9 for the red sub-pixel unit extends to the adjacent red sub-pixel (or the blue sub-pixel and the green sub-pixel) so that the cover electrode may be used to repair the adjacent pixel unit (or adjacent red sub-pixel unit). In an alternative embodiment, the cover electrode on the gas discharging structure 9 corresponding to at least one thin film transistor region extends to an adjacent thin film transistor region, such that the cover electrode may be used for repairing the adjacent thin film transistor. Of course, two thin film transistors may be provided in the same pixel unit (or sub-pixel unit), for example, the cover electrode on the gas discharging structure corresponding to the drain region of one of two adjacent thin film transistors extends to the source region of the other of the two adjacent thin film transistors.

In this embodiment, the gas discharging structure 9 may be formed as a blind hole running through at least a part of the thickness of the resin layer 5 or a through-hole running through the entire thickness of the resin layer 5. When the gas discharging structure 9 is formed as a blind hole, the depth of the gas discharging structure 9 is less than or equal to the thickness of the resin layer 5, and the ratio of the depth of the blind hole to the thickness of the resin layer 5 is between 0.04-0.1, for example 0.04, 0.05, 0.06, 0.07, 0.08, 0.09 or 0.1, and the depth of the blind hole may be set according to the specific conditions of the array substrate.

In this embodiment, the resin layer 5 is located between the layer, where the data line 10 is located, and the pixel electrode 8, and the resin layer 5 may include a color filter layer. The color filter layers for the pixel units may be provided as a continuous layer; the color filter layers for part or all of the pixel units may be independent from each other. Alternatively, the color filter layers for the pixel units in the same row or column are formed as an integral structure, that is, the color filter layers for the pixel units in the same row or column are connected to each other. The color filter layers may be of a single color or a combination of multiple colors. For example, the color filter layer may include red, green and blue colors, and may also be a combination of other colors.

When the color filter layer is disposed in the resin layer 5, the bubbles existed in the resin layer 5 and the color filter layer may be discharged by the gas discharging structure 9 provided in the resin layer 5 and the color filter layer, so as to prevent the gas from adversely affecting the resin layer 5 and the color filter layer and the subsequent manufacturing process.

In an embodiment, a passivation layer 6 is disposed between the layer, where the data line 10 is located, and the color filter layer. Alternatively, a passivation layer 6 is disposed between the pixel electrode 8 and the color filter layer. In an exemplary embodiment, as shown in FIG. 1, a common electrode 7 is disposed below the pixel electrode 8. The thin film transistor 4 and the pixel electrode 8 connected to the thin film transistor 4 are disposed on the substrate 1. The thin film transistor 4 comprises a gate 2 electrically connected to the gate line, a gate insulating layer 3, a semiconductor layer 42, a source 411 electrically connected to the data line and a drain 412 electrically connected to the pixel electrode. The resin layer 5, the common electrode 7 and the passivation layer 6 are disposed between the pixel electrode and the layer where the source and the drain are located. The pixel electrode 8 is connected to the drain 412 through a via Q. The passivation layer 6 is located between the pixel electrode 8 and the common electrode 7, and the common electrode 7 is disposed below the pixel electrode 8. The gate 2 is disposed in the same layer as the gate line, and the layer where the source and the drain are located is disposed in the same layer as the data line. Generally, the gate 2 is disposed in the same layer with the gate line, and the gate and the gate line are formed as an integral structure. The source and the drain are disposed in the same layer as the data line.

In an embodiment, in some display modes of the array substrate, the pixel electrode 8 may include a slit structure.

Light transmittance of the pixel electrode 8 with the slit structure is better, which makes the array device have a better display effect. There are other combinations of pixel electrode and common electrode. For example, the pixel electrode is disposed below the common electrode, and the pixel electrode is a plate, and the common electrode includes a slit structure. Alternatively, the pixel electrode is disposed on the same layer as the common electrode, and the pixel electrode and the common electrode are spaced from each other so as to form a slit structure. Alternatively, the pixel electrode is disposed on the array substrate, and the common electrode is disposed on the opposite substrate, and the pixel electrode includes a slit structure.

Another embodiment of the present disclosure provides a display device, such as a liquid crystal display (LED) device or a flat panel display device such as an OLED display device. When the liquid crystal display device is used, the display device includes the array substrate mentioned in the above embodiment, an opposed substrate, and a liquid crystal layer disposed between the array substrate and the opposite substrate. Due to a better display effect of the array substrate, the product yield is high, and the display device including the array substrate also has a better display effect and product yield.

Directional terms such as "up", "down", "front", "back", "left", "right" and the like mentioned in the embodiments are used only with reference to the drawings, unless otherwise specified, the directional terms are not intended to limit the scope of the present disclosure. Moreover, the foregoing embodiments may be used in combination with one another or mixed with other embodiments based on design considerations and reliability considerations, that is, the technical features in different embodiments may be freely combined to form more embodiments.

The objectives, technical solutions and beneficial effects of the present disclosure have been further described in detail with reference to the specific embodiments described above. It should be understood that the above is only the specific embodiments of the present disclosure and not intended to limit the present disclosure. Any modification, equivalent replacement, improvement and the like made within the spirit and principle of the present disclosure should be included in the protection scope of the present disclosure.

Those skilled in the art may make various modifications and variations to the embodiments of the present disclosure without departing from the spirit and scope of the present disclosure. In this way, if these modifications and variations of the present disclosure fall within the scope of the claims of the present disclosure and its equivalent technologies, the present disclosure is also intended to include these changes and modifications.

What is claimed is:

1. An array substrate, comprising:
   a substrate; and
   a plurality of data lines and a plurality of gate lines disposed on the substrate, the data lines and the gate lines being configured to define a plurality of pixel units,
   wherein each pixel units comprises:
   a pixel electrode;
   a thin film transistor electrically connected to the data line and the gate line and configured to drive the pixel electrode; and
   a resin layer disposed on the data line and/or the gate line and provided with at least one gas discharging structure each having an opening facing away from the substrate.

2. The array substrate according to claim 1, wherein the at least one gas discharging structure is disposed in a region of the resin layer that at least partially covers the thin film transistor.

3. The array substrate according to claim 1, wherein at least one of the gas discharging structures is disposed in a region of the resin layer that is overlapped with at least one of the gate line and the data line.

4. The array substrate according to claim 1, wherein the resin layer is provided with at least two gas discharging structures.

5. The array substrate according to claim 4, wherein the resin layer is provided with two gas discharging structures and a ratio of depths of openings of the two gas discharging structures is 1:10-1.

6. The array substrate according to claim 1, wherein the pixel unit includes a red sub-pixel unit, a green sub-pixel unit, and a blue sub-pixel unit, and the gas discharging structure is disposed only in a region of the resin layer aligned with the blue sub-pixel unit.

7. The array substrate according to claim 1, wherein the pixel unit includes a red sub-pixel unit, a green sub-pixel unit, and a blue sub-pixel unit, and the gas discharging structure is disposed in each region of the resin layer aligned with a corresponding sub-pixel unit.

8. The array substrate according to claim 1, further comprising a cover electrode disposed in the same layer as the pixel electrode, the cover electrode covering at least a part of the gas discharging structure.

9. The array substrate according to claim 8, wherein the cover electrode on the gas discharging structure corresponding to at least one pixel unit extends to an adjacent pixel unit; or
   the cover electrode on the gas discharging structure corresponding to at least one thin film transistor region extends to an adjacent thin film transistor region.

10. The array substrate according to claim 1, wherein the gas discharging structure is formed as a blind hole running through at least a part of a thickness of the resin layer, a ratio of a depth of the blind hole to a thickness of the resin layer being between 0.04-0.1; or
    the gas discharging structure is formed as a through-hole running through the entire thickness of the resin layer.

11. The array substrate according to claim 1, wherein the resin layer is located between the data line and the pixel electrode, and comprises a color filter layer.

12. The array substrate according to claim 11, wherein a passivation layer is disposed between the data line and the color filter layer; or the passivation layer is disposed between the pixel electrode and the color filter layer.

13. The array substrate according to claim 12, further comprising a common electrode, wherein the passivation layer is located between the pixel electrode and the common electrode.

14. A display device, comprising the array substrate according to claim 1 and an opposed substrate arranged opposite tote array substrate.

15. The display device according to claim 14, wherein the at least one gas discharging structure is disposed in a region of the resin layer that at least partially covers the thin film transistor.

16. The display device according to claim 14, wherein at least one of the gas discharging structures is disposed in a region of the resin layer that is overlapped with at least one of the gate line and the data line.

17. The display device according to claim 14, wherein the resin layer is provided with two gas discharging structures and a ratio of depths of openings of the two gas discharging structures is 1:10-1.

18. The display device according to claim 14, further comprising a cover electrode disposed in the same layer as the pixel electrode, the cover electrode covering at least a part of the gas discharging structure.

19. The display device according to claim 18, wherein the cover electrode on the gas discharging structure corresponding to at least one pixel unit extends to an adjacent pixel unit; or the cover electrode on the gas discharging structure corresponding to at least one thin film transistor region extends to an adjacent thin film translator region.

20. The display device according to claim 14, wherein the gas discharging structure is formed as a blind hole running through at least a part of a thickness of the resin layer, a ratio of a depth of the blind hole to a thickness of the resin laser being between 0.04-0.1; or the gas discharging structure is formed as a through-hole running through the entire thickness of the resin layer.

* * * * *